(12) United States Patent
Kim et al.

(10) Patent No.: US 10,867,677 B2
(45) Date of Patent: Dec. 15, 2020

(54) SINGLE POLY MULTI TIME PROGRAM CELL AND METHOD OF OPERATING THE SAME

(71) Applicant: KEY FOUNDRY CO., LTD., Cheongju-si (KR)

(72) Inventors: Su Jin Kim, Cheongju-si (KR); Myeong Seok Kim, Cheongju-si (KR); In Chul Jung, Daegu (KR); Young Bae Kim, Cheongju-si (KR); Seung Guk Kim, Cheongju-si (KR); Jung Hwan Lee, Cheongju-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 41 days.

(21) Appl. No.: 16/123,725

(22) Filed: Sep. 6, 2018

(65) Prior Publication Data

US 2019/0237140 A1    Aug. 1, 2019

(30) Foreign Application Priority Data

Jan. 30, 2018 (KR) .................. 10-2018-0011394

(51) Int. Cl.
| | |
|---|---|
| *G11C 11/34* | (2006.01) |
| *G11C 16/04* | (2006.01) |
| *H01L 27/11536* | (2017.01) |
| *G11C 16/14* | (2006.01) |
| *H01L 29/788* | (2006.01) |
| *H01L 27/092* | (2006.01) |
| *G11C 16/26* | (2006.01) |

(Continued)

(52) U.S. Cl.
CPC ...... *G11C 16/0425* (2013.01); *G11C 16/0433* (2013.01); *G11C 16/10* (2013.01); *G11C 16/14* (2013.01); *G11C 16/26* (2013.01); *H01L 27/092* (2013.01); *H01L 27/11536* (2013.01); *H01L 27/11558* (2013.01); *H01L 29/7883* (2013.01); *H01L 29/7884* (2013.01); *G11C 2216/10* (2013.01)

(58) Field of Classification Search
CPC . G11C 16/0425; G11C 16/0433; G11C 16/10; G11C 16/14; H01L 27/092; H01L 27/11536; H01L 27/11558; H01L 29/7883; H01L 29/7884
See application file for complete search history.

(56) References Cited

U.S. PATENT DOCUMENTS 8,975,679 B1 *   3/2015   Chen ................. H01L 27/11558
                                                       257/298
9,805,806 B2 *  10/2017   Chen ..................... G11C 16/14
(Continued)

FOREIGN PATENT DOCUMENTS

KR    10-2017-0086178 A    7/2017

*Primary Examiner* — Toan K Le
(74) *Attorney, Agent, or Firm* — NSIP Law

(57) ABSTRACT

A single poly multi time program (MTP) cell includes a second conductivity-type well, a sensing transistor comprising a drain, a sensing gate, and a source, a drain electrode connected to the drain, a source electrode connected to the source; a control gate connected to the sensing gate of the sensing transistor, and a control gate electrode, wherein the sensing transistor, the drain electrode, the source electrode, the control gate, and the control gate electrode are located on the second conductivity-type well.

29 Claims, 11 Drawing Sheets

(51) Int. Cl.
*H01L 27/11558* (2017.01)
*G11C 16/10* (2006.01)

(56) References Cited

U.S. PATENT DOCUMENTS

| | | | |
|---|---|---|---|
| 2009/0201742 A1* | 8/2009 | Lee | G11C 16/0441 |
| | | | 365/185.24 |
| 2009/0267127 A1* | 10/2009 | Chen | G11C 16/10 |
| | | | 257/314 |
| 2010/0032744 A1 | 2/2010 | Mitros et al. | |
| 2010/0157669 A1* | 6/2010 | Audzeyeu | G11C 16/0441 |
| | | | 365/185.1 |
| 2010/0157690 A1* | 6/2010 | Jung | G11C 16/10 |
| | | | 365/185.29 |
| 2010/0302854 A1* | 12/2010 | Wu | G11C 11/34 |
| | | | 365/185.18 |
| 2017/0207231 A1* | 7/2017 | Kim | H01L 27/11558 |

* cited by examiner

SINGLE POLY MULTI TIME PROGRAM CELL AND METHOD OF OPERATING THE SAME

CROSS-REFERENCE TO RELATED APPLICATIONS

This application claims the benefit under 35 USC 119(a) of Korean Patent Application No. 10,2018/001,139.4 filed on Jan. 30, 2018 in the Korean Intellectual Property Office, the entire disclosure of which is incorporated herein by reference for all purposes.

BACKGROUND

1. Field

The following description relates to a single poly Multi Time Program (MTP) cell. The following description also relates to a structure of a single poly MTP cell and a method of operating the same capable of adopting an operation method of preventing the over-erase. Such a structure and method allow for removing a selection transistor for preventing the over-erase, in order to reduce a size of the MTP cell.

2. Description of Related Art

A Non-Volatile Memory (NVM) is a memory device that stably maintains data stored therein for a long period of time, even if the power source is turned off. An Electrically Erasable Programmable Read Only Memory (EEPROM) and a flash memory may each be a non-volatile memory element, in wide general use. In particular, the non-volatile memory element may store data even with a low power supply, so such technologies are widely used in a portable electronic device.

The EEPROM technology widely used recently is generally implemented using a NMOS double poly cell. In such a technology, the double poly EEPROM cell is required to form two layers of poly-silicon layer, requiring a special manufacturing process beyond the standard complementary metal-oxide-semiconductor (CMOS) manufacturing process. Accordingly, the preference for using a single poly EEPROM or a Multi Time Programmable (MTP) memory that may be manufactured using the standard CMOS manufacturing process increases.

Program and erase operations of the MTP cell are implemented by injecting or erasing electrons or holes into a floating gate. By injecting electrons or holes into the floating gate, more specifically, various methods, such as Fowler-Nordheim (F-N) Tunneling, Hot electron injection, Band to band tunneling (BTBT), UV erase, for example, may be used. The conventional MTP cell of the F-N tunneling method is over-erased to result in a large leakage current, or has a selection transistor for preventing the over-erase phenomenon from causing an increase in the cell area. Furthermore, the conventional MTP cell of the F-N tunneling method requires a high voltage for generating the tunneling in operation, and thus there has been the problem in that the element used in a peripheral circuit for driving the MTP cell is composed of a high-voltage element. Even if a medium-voltage element is used in such an MTP cell, the gap for insulation between the elements is increased to increase the size of the MTP intellectual property (IP) cell. Furthermore, in order to obtain a breakdown voltage, a high-voltage well has been used even in the MTP cell, or the gap for insulation has been increased to also increase the size of the cell. Accordingly, since the sizes of the MTP cell and IP are large, there is an issue in that it is difficult to provide a high-density MTP IP, as demanded in recent markets, in a small physical area.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a single poly multi time program (MTP) cell includes a second conductivity-type well, a sensing transistor comprising a drain, a sensing gate, and a source, a drain electrode connected to the drain, a source electrode connected to the source, a control gate connected to the sensing gate of the sensing transistor, and a control gate electrode, wherein the sensing transistor, the drain electrode, the source electrode, the control gate, and the control gate electrode are located on the second conductivity-type well.

The single poly MTP cell may further include a first conductivity-type shallow well located on an upper portion of the second conductivity-type well and located on a lower portion of the control gate.

The sensing gate of the sensing transistor may be implemented by a tunneling region providing a movement path of electrons or holes toward a lower end of the tunneling region.

The cell may form a floating gate comprising the sensing gate and the control gate.

The drain and the source of the sensing transistor may be formed of a second doping layer and a third doping layer that are located on an upper portion of the second conductivity-type well on lower portions of the drain electrode and the source electrode, respectively.

The single poly MTP cell may further include a fourth doping layer formed on a lower portion of the control gate electrode.

High concentrations of cell Lightly Doped Drain (LDD) and/or Halo Implant areas may be added in an entire region or some regions of the single poly MTP cell.

The single poly MTP cell may further include a sensing transistor region in which the drain electrode, the sensing transistor, and the source electrode on the second conductivity-type well are located, and a control gate region in which the control gate and the control gate electrode on the second conductivity-type well or the first conductivity-type well are located.

The single poly MTP cell may further include an isolation film interposed between the sensing transistor region and the control gate region so as to separate the sensing transistor region and the control gate region.

A plurality of pulse voltages repeated during the erase time or the program time for the erase operation and the program operation may be applied to the drain electrode, the source electrode, and the control gate electrode, and the current flowing into the single poly MTP cell between the plurality of repeated pulse voltages may be measured to determine the completion of the erase operation or the program operation.

In another general aspect, a single poly multi time program (MTP) cell includes a second conductivity-type well, a first conductivity-type well located adjacent to the second conductivity-type well, a sensing transistor comprising a drain, a sensing gate, and a source, a drain electrode connected to the drain, a source electrode connected to the source, a control gate connected to the sensing gate, and a control gate electrode, wherein the sensing transistor, the drain electrode, and the source electrode are located on the second conductivity-type well, and wherein the control gate and the control gate electrode are located on the first conductivity-type well.

The sensing gate of the sensing transistor may be implemented by a tunneling region providing a movement path of electrons or holes toward a lower end of the tunneling region.

The cell may form a floating gate comprising the sensing gate and the control gate.

The drain and the source of the sensing transistor may be formed of a second doping layer and a third doping layer that are located on an upper portion of the second conductivity-type well on lower portions of the drain electrode and the source electrode, respectively.

The single poly MTP cell may further include a fourth doping layer formed on a lower portion of the control gate electrode.

High concentrations of cell Lightly Doped Drain (LDD) and/or Halo Implant areas may be added in an entire region or some regions of the single poly MTP cell.

The single poly MTP cell may further include a sensing transistor region in which the drain electrode, the sensing transistor, and the source electrode on the second conductivity-type well are located, and a control gate region in which the control gate and the control gate electrode on the second conductivity-type well or the first conductivity-type well are located.

The single poly MTP cell may further include an isolation film interposed between the sensing transistor region and the control gate region so as to separate the sensing transistor region and the control gate region.

A plurality of pulse voltages repeated during the erase time or the program time for the erase operation and the program operation may be applied to the drain electrode, the source electrode, and the control gate electrode, and the current flowing into the single poly MTP cell between the plurality of repeated pulse voltages may be measured to determine the completion of the erase operation or the program operation.

In another general aspect, erase method of a single poly multi time program (MTP) cell, the cell including a sensing transistor and a control gate, and a drain electrode, a source electrode, and a control gate electrode connected to a drain, a source of the sensing transistor, and the control gate, respectively, the method including applying a voltage for an erase operation to the drain electrode, the source electrode, and the control gate electrode during a setting time period, measuring a current in the single poly MTP cell, determining whether the measured current is greater than a first setting value, repetitively performing the applying, measuring and determining in response to the measured current being smaller than or equal to the first setting value as a result of the determining, and confirming that the erase has been completed and terminating the method in response to the measured current being greater than the first setting value as a result of the determining.

The applying may apply a GND voltage to the source electrode, may apply a positive voltage (VPP) to the drain electrode, and may apply the voltage that is greater than or equal to the voltage applied to the source electrode to the control gate electrode.

The repetitively performing may include comparing a number of times that the applying is performed with a third setting value, terminating the erase operation by determining as the erase operation failure in response to the number of times being greater than the third setting value as a result of the comparison, and performing the applying, measuring, and determining in response to the number of times being smaller than or equal to the third setting value as a result of the comparison.

The measuring may include applying a GND voltage to the source electrode, and applying a low voltage for causing the holes injected into a floating gate not to exit the floating gate into the drain electrode and the control gate electrode.

The drain electrode may be applied with a first voltage greater than the GND voltage, and the control gate electrode may be applied with a second voltage greater than the first voltage.

In another general aspect, a program method of a single poly multi time program (MTP) cell, the cell including a sensing transistor and a control gate, and a drain electrode, a source electrode, and a control gate electrode connected to a drain, a source of the sensing transistor, and the control gate, respectively, the method comprising applying a voltage for a program operation to the drain electrode, the source electrode, and the control gate electrode during a setting time period, measuring a current in the single poly MTP cell, determining whether the measured current is greater than a second setting value, repetitively performing the applying, measuring, and determining in response to the measured current being greater than the second setting value as a result of the determining, and confirming that the program has been completed and terminating the method in response to the measured current being smaller than or equal to the second setting value as a result of the determining.

The applying may include applying a positive voltage (VPP) to the drain electrode and the control gate electrode, and applying a voltage lower than the positive voltage (VPP) applied to the drain electrode and the control gate electrode to the source electrode.

The applying may include applying a GND voltage to the source electrode, applying a positive voltage (VPP) to the control gate electrode, and applying a positive voltage that is smaller than that of the control gate electrode to the drain electrode.

The repetitively performing may include comparing a number of times that the applying is performed with a fourth setting value, terminating the program by determining as the program failure in response to the number of times being greater than the fourth setting value as a result of the comparison, and performing the applying, measuring, and determining in response to the number of times being smaller than or equal to the fourth setting value as a result of the comparison.

The measuring may include applying a GND voltage to the source electrode, and applying a low voltage for causing the electrons injected into a floating gate not to exit the floating gate to the drain electrode and the control gate electrode.

The drain electrode may be applied with a first voltage that is greater than a GND voltage, and the control gate electrode is applied with a second voltage that is greater than the first voltage.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
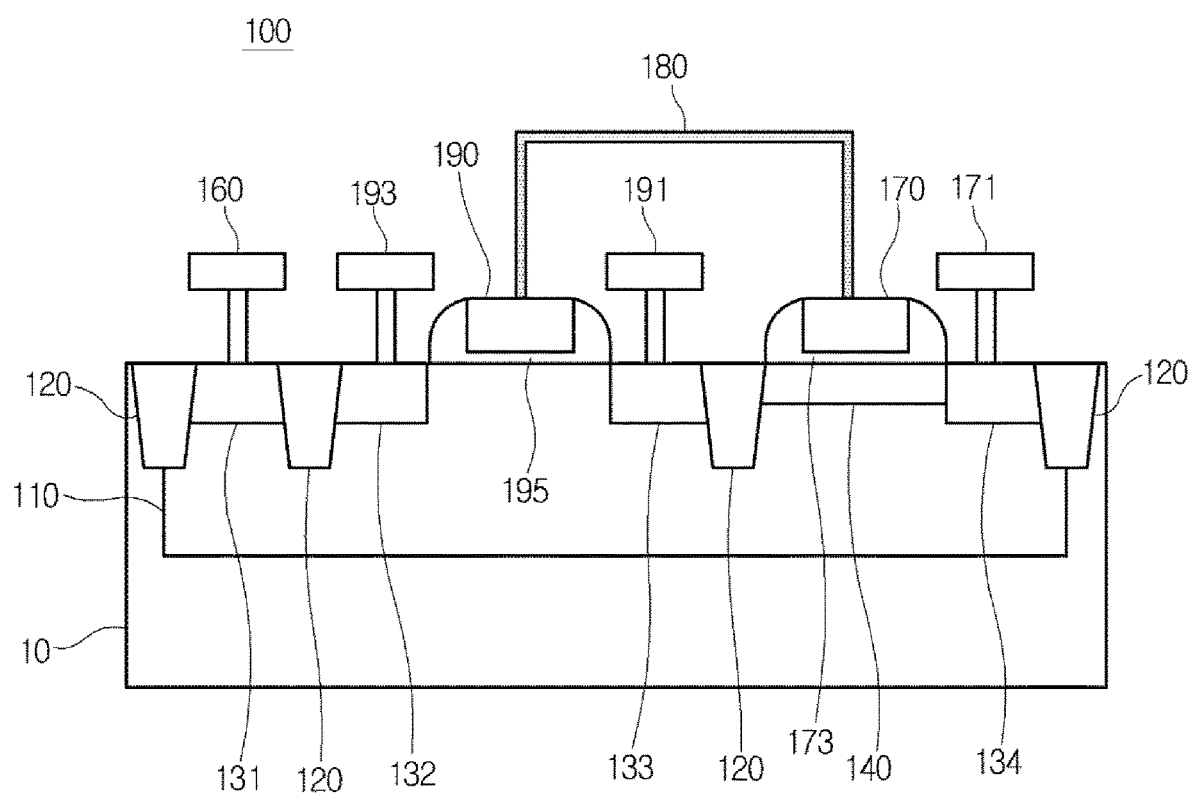
FIGS. 1 and 2 are views illustrating structures of a single poly MTP cell in accordance with examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Descriptions of irrelevant components are omitted from the drawings so as to clearly describe the exemplary embodiments of the present disclosure, throughout this specification, the same or like elements are denoted by the same reference numerals.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be additionally interpreted as having a meaning that is consistent with their meaning in the context of the relevant art and/or the present disclosure, and will not be interpreted in an idealized or overly formal sense unless expressly so defined herein.

Hereinafter, examples will be described in detail with reference to the accompanying drawings so that those skilled in the art may easily practice the present disclosure. The present disclosure may be implemented in various different forms, and is not limited to the examples described herein.

Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

One object of the examples is to provide a MTP cell capable of removing a selection transistor and being composed of only a sensing transistor and a control gate, thus reducing the area of such an MTP cell.

Another object of the examples is to provide an MTP cell capable of operating at a lower voltage than that associated with an F-N tunneling method and performing the program and the erase operations using Hot Injection and BTBT methods in order to reduce the risk over being over-erased in the erase operation.

Yet another object of the examples is to provide a method of operating the MTP cell so as to be capable of monitoring cell current while applying a very short pulse voltage during the program and erase operations of the MTP cell, thus having less risk of the over-erase phenomenon and assisting in determining the erase and program times.

Thus, in accordance with certain examples, examples have the advantage that they may operate at a lower voltage than in the conventional MTP cell, thus eliminating or reducing the region for the high-voltage well or for insulation to thereby dramatically reduce the size of the MTP cell.

Figure 2:
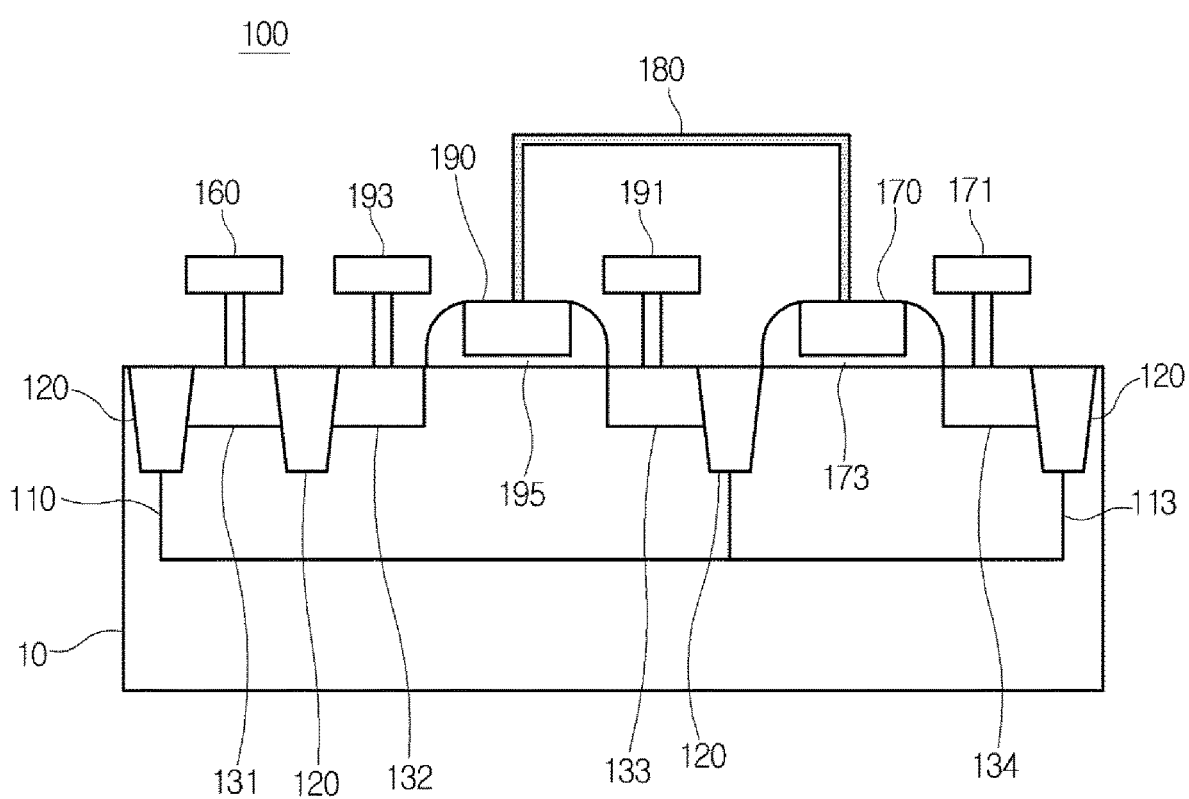

FIGS. 1 and 2 are views illustrating structures of a single poly MTP cell in accordance with an example.

Referring to the examples of FIGS. 1 and 2, a single poly MTP cell 100 may include a second conductivity-type substrate 10, a second conductivity-type well 110, a isolation film 120, first to fourth doping layers 131 to 134, a control gate 170, a floating gate 180, a sensing gate 190, a control gate electrode 171, a source electrode 191 and a drain electrode 193 of a sensing transistor, and may further include a body electrode 160.

The single poly MTP cell 100 may have an advantage that it is able to be improved to a single poly structure using one single poly in the double poly structure of the alternative art to simplify the additional masks and manufacturing processes, thus implementing cost savings and the shortening of the manufacturing time. Such an approach may also have the additional advantage that it may be improved to have a structure removing the selection transistor for preventing the over-erase phenomenon in the conventional single poly MTP cell, thus reducing the size of the cell. That is, the single poly MTP cell proposed in the examples may remove the selection transistor of alternative technologies, and may be composed of only a sensing transistor and a control gate to thereby reduce the size of the cell. Furthermore, as another characteristic of examples, the single poly MTP cell 100 proposed in the examples may be manufactured so as to be compatible with a basic logic process for manufacturing a semiconductor chip.

The second conductivity-type substrate 10 may correspond to a base of the single poly MTP cell 100. In one example, the second conductivity-type substrate 10 is implemented by a P-type substrate. The second conductivity-type substrate 10 is formed on the lowermost portion of the single poly MTP cell 100.

As illustrated in the example of FIG. 1, the second conductivity-type well 110 may be formed in the second conductivity-type substrate 10 in the entire region constituting the single poly MTP cell 100. The second conductivity-type well 110 may be formed by doping and diffusing a second conductivity-type impurity on the second conductivity-type substrate 10.

Alternatively, as illustrated in the example of FIG. 2, the second conductivity-type well 110 may be formed at one side of the second conductivity-type substrate 10, in the second conductivity-type substrate 10, in order to make a sensing transistor region and a body region in the single poly MTP cell 100, and a first conductivity-type well 113 can be formed at the other side of the second conductivity-type substrate 10 in the second conductivity-type substrate 10 in order to make a control gate region in the single poly MTP cell 100.

The sensing gate 190 may be formed on the second conductivity-type well 110, and the control gate 170 may be formed on a first conductivity-type shallow well 140 formed within the second conductivity-type well 110 as illustrated in the example of FIG. 1, or formed on the first conductivity-type well 113 as illustrated in the example of FIG. 2.

The second doping layer 132 and the third doping layer 133 may be placed inside the second conductivity-type well 110 to form a drain and a source of the sensing transistor. More specifically, the second doping layer 132 may be formed on the portion adjacent to the sensing gate 190, and the third doping layer 133 may be also adjacent to the sensing gate 190 and formed at the opposite side of the second doping layer 132 with respect to the sensing gate 190. Additionally, the sensing transistor may be formed by combining a drain, a source, and a sensing gate. As one example, the third doping layer 133 may be adjacent to one side surface close to the control gate electrode 171 of the sensing gate 190. Also, the second doping layer 132 may be adjacent to the side surface that is farther away from the control gate electrode 171 of the sensing gate 190. However, the structure of examples is not limited thereto, and variations that provide the same functionality are present in other examples.

The second doping layer 132 and the third doping layer 133 may be formed on an upper portion of the second conductivity-type well 110 at a predetermined depth. As one example, the second doping layer 132 and the third doping layer 133 may be implemented as an N+ doping layer by injecting a high-concentration ion into the second conductivity-type well 110. The energy and the dose amount of the ion injection may be adjusted for the second doping layer 132 and the third doping layer 133 to form each of the second doping layer 132 and the third doping layer 133 at a predetermined depth.

The fourth doping layer 134 may be formed adjacent to the control gate 170 on an upper portion of the second conductivity-type well 110 or the first conductivity-type well 113. In one example, the fourth doping layer 134 may be formed by doping a first conductivity-type impurity, and implemented as a N+ doping layer by injecting a high-concentration ion when forming the fourth doping layer 134.

The first doping layer 131 may be formed on the upper portion of the second conductivity-type well 110. In one example, the first doping layer 131 may be implemented as a P+ doping layer by injecting a high-concentration ion when forming the first doping layer 131, and the energy and the dose amount of the ion injection may be adjusted in order to form the first doping layer 131 at a predetermined depth.

The first conductivity-type shallow well 140, as illustrated in the example of FIG. 1, may be formed on a lower portion of the control gate 170, if the second conductivity-type well 110 is formed in the entire region constituting the single poly MTP cell 100. As one example, the first conductivity-type shallow well 140 may be implemented as an N-type shallow well by injecting a N-type ion when forming the first conductivity-type shallow well 140, and the energy and the dose amount of the ion injection may be adjusted in order to form the first conductivity-type shallow well 140 at a predetermined depth. In particular, the depth of the first conductivity-type shallow well 140 may be adjusted to be thinner than the depth of the isolation film 120. The first conductivity-type shallow well 140 does not need an isolation distance for reducing the interference influence on adjacent single poly MTP cells 100 in the program and erase operations. Thus there is an effect that is able to significantly reduce the area of the entire cell as compared to alternative technologies.

The isolation film 120 may be interposed between each region for causing the isolation between a body region, a sensing transistor region, and a control gate region. In one example, the isolation film 120 can be formed by Shallow Trench Isolation (STI) or Local Oxidation of Silicon (LOCOS).

The sensing transistor may be implemented by using the second doping layer 132, the third doping layer 133, and the sensing gate 190. The sensing transistor may provide the movement path of electrons and/or holes toward the lower end of the sensing transistor. More specifically, the sensing transistor may move electrons and/or holes, depending upon the voltage difference, between the control gate electrode 171 and the drain electrode 193.

In one example, a first insulating layer 195 may be formed to have an appropriate thickness that electrons and/or holes may move. Meanwhile, in an example, the first insulating layer 195 and a second insulating layer 173 are implemented as having the same thickness, but examples is not limited thereto, and the first insulating layer 195 and the second insulating layer 173 may also have differing thicknesses.

In examples, the control gate 170 may be formed on the upper portion of the first conductivity-type shallow well 140 or the upper portion of the first conductivity-type well 113. Also, the control gate 170 may be connected with the gate of the sensing transistor, that is, the sensing gate 190. More specifically, the control gate 170 may be connected with the sensing gate 190 through the floating gate 180 formed on the same plane as the control gate 170.

The floating gate 180 may have one end connected with the control gate 170 and the other end connected with the sensing gate 190 between the control gate 170 and the sensing gate 190. In such an example, the sensing gate 190 and the control gate 170 may be connected through the floating gate 180. Alternatively, the floating gate 180 may be configured to include the control gate 170 and the sensing gate 190.

The floating gate 180 may inject and/or emit electrons and/or holes, depending upon the voltage applied to the control gate electrode 171 and the drain electrode 193. In one example, the floating gate 180 may program data by injecting electrons, and may erase the data by emitting electrons or by injecting holes.

The drain electrode 193 may be placed on the upper portion of the second doping layer 132. More specifically, the drain electrode 193 may provide the voltage for performing the program-erase operations through the second doping layer 132. The drain electrode 193 and the control gate electrode 171 may provide an operation voltage for performing the program-erase operations, and accordingly program or erase data depending upon the operation voltage that is provided. Furthermore, the drain electrode 193 may be implemented by using a bit line.

The single poly MTP cell 100 may read data depending upon the amount of electrons and/or holes injected into or emitted into the floating gate 180. That is, the single poly MTP cell 100 may apply a voltage to the drain electrode 193 and the source electrode 191 of the sensing transistor, and the control gate electrode 171, to read the data programmed in the single poly MTP cell 100 based on the measured current amount.

The control gate electrode 171 may be placed on the upper portion of the fourth doping layer 134 in order to perform the program-erase operation through appropriate transmission through the fourth doping layer 134.

For example, the body electrode 160 may be formed on the upper portion of the first doping layer 131.

In summary, the single poly MTP cell 100 proposed in the examples has the control gate 170 formed on the first conductivity-type well 113 or the first conductivity-type shallow well 140, and the sensing gate 190 formed on the second conductivity-type well 110. In this example, the selection transistor, as used in an alternative MTP cell, does not exist.

As another example, Lightly Doped Drain (LDD) and/or Halo Implant approaches may be added in the entire region or some regions of the single poly MTP cell.

Figure 3:
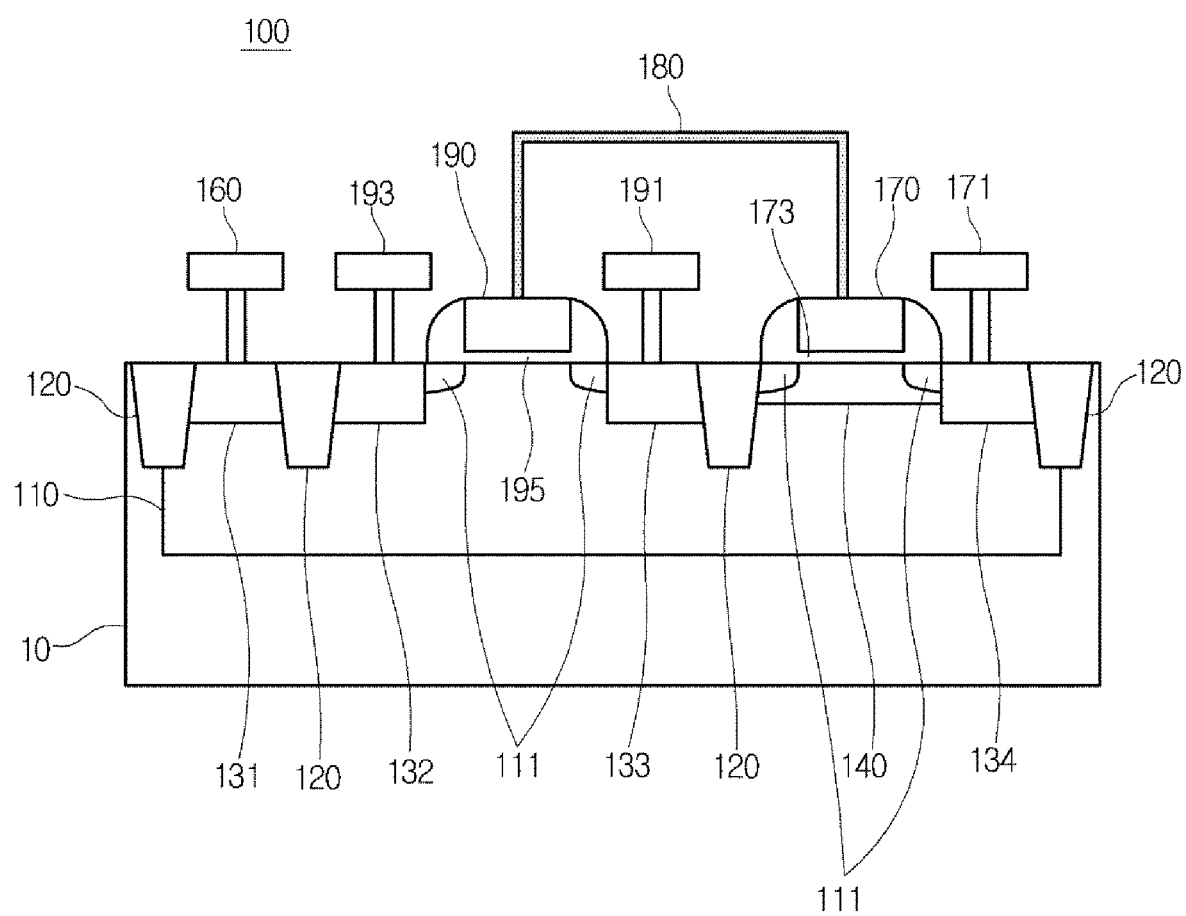
FIGS. 3 and 4 are views illustrating structures of the single poly MTP cell to which LDD and/or Halo Implant are added in accordance with examples.
Figure 4:
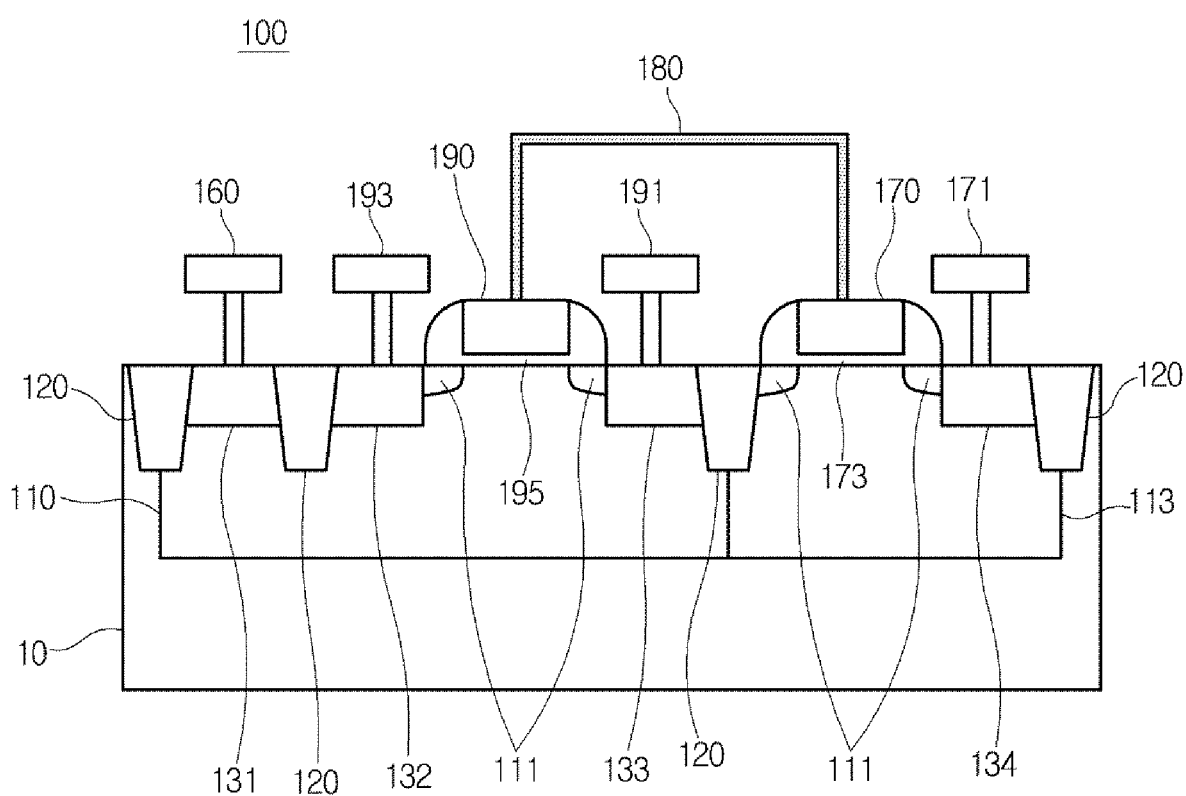

FIGS. 3 and 4 are views illustrating structures of a single poly MTP cell to which LDD and/or Halo Implant are added, in accordance with examples.

More specifically, an LDD and/or Halo Implant region 111 may be placed on the portions adjacent to the control gate 170 and the gate of the sensing transistor, as shown in FIGS. 3-4. More specifically, the LDD and/or Halo Implant region 111 may be formed on the upper end of the second conductivity-type well 110 adjacent to the gate of the sensing transistor and the control gate, and formed on the upper end of the second conductivity-type well 110 adjacent to the gate of the sensing transistor and the upper end of the first conductivity-type well 113 or the upper end of the first conductivity-type shallow well 140 adjacent to the control gate. The LDD and/or Halo Implant region 111 are formed by injecting a higher concentration ion than an LDD used in the alternative CMOS processes. For example, the LDD used in the alternative CMOS process is injected with a low-concentration of ions during injection in order to reduce the Hot carrier effect. However, on the contrary, the LDD of the examples is formed by injecting a high-concentration ion. As a result, it is possible to increase the Hot carrier effect, in order to enhance the margin of the program and erase operations of the control gate 170, and thus, to increase the number of the successful program and erase operations of the data to enhance the reliability of operation.

As one example, the Halo Implant region discussed further above may be formed by injecting Boron (B) or a Boron compound such as Boron Difluoride ($BF_2$) having a concentration of 1.0E11 to 1.0E14 atoms/$cm^3$ with an energy of 5~50 KeV, and the LDD implant may be formed by injecting Arsenic (As) or Phosphorous (P) having a concentration of 5.0E13 to 1.0E16 atoms/$cm^{-3}$ with an energy of 5~50 KeV, but it is not limited thereto. That is, the Halo Implant region is implemented by a higher concentration ion than the LDD implant used in the standard CMOS process.

In one example, the single poly MTP cell 100 applies a GND voltage to the source electrode 191 and the body electrode 160 for the program operation, and applies the voltage for the program operation itself to the drain electrode 193 and the control gate electrode 171, but operation of the single poly MTP cell 100 is not limited thereto. For example, the single poly MTP cell 100 may apply a voltage lower than the voltage for the program operation to the source electrode 191. In this example, the voltage applied to the control gate electrode 171 may be equal to or greater than the voltage applied to the drain electrode 193 of the sensing transistor. Subsequently, electrons are injected into the floating gate 180 through the first insulating layer 195 due to a high electric field applied to the drain of the sensing transistor and the control gate 170 in the Hot carrier injection method, and stored in the floating gate 180 accordingly. That is, electrons may be injected through the sensing transistor to program data. In this example, the time during which the voltage is applied is very short time period of 1~1000 µs, and the voltage application may be repetitively performed.

In another example, the single poly MTP cell 100 applies a GND voltage to the source electrode 191 and the body electrode 160 for the erase operation, and applies the voltage for the erase operation to the drain electrode 193 and the control gate electrode 171. In this example, the voltage applied to the control gate electrode 171 may be equal to or greater than GND applied to the source electrode 191 and the body electrode 160, and the voltage that is much greater than the voltage applied to the control gate electrode 171 may be applied to the drain electrode 193 for 1~1000 µs to perform the erase operation. That is, holes may be injected into the floating gate 180 through the first insulating layer 195 by the potential difference between the control gate and the drain, or the electrons injected into the floating gate 180 may be emitted through the first insulating layer 195 to perform the erase operation.

In this example, the short pulse applied in the program operation or the erase operation may be adjusted to an optimal time period depending upon the design or the technology of the MTP cell, or the process characteristics. After applying the program voltage or the erase voltage thereto during a short time period, the general program and erase operations measure the currents of the MTP cell through the read operation. If the measured currents do not reach the desired program and erase current values, the operation of applying a pulse voltage for several or dozens of instances and measuring the current in the MTP cell is repeated in order to reach the desired program current or the erase current.

In one example, the single poly MTP cell 100 may implement the first type as being an N type, and the second type as a P type, but the single poly MTP cell 100 is not limited thereto. FIGS. 1 to 4 are shown for explaining and presenting one example, and are not intended to limit the scope of the present examples.

Figure 5:
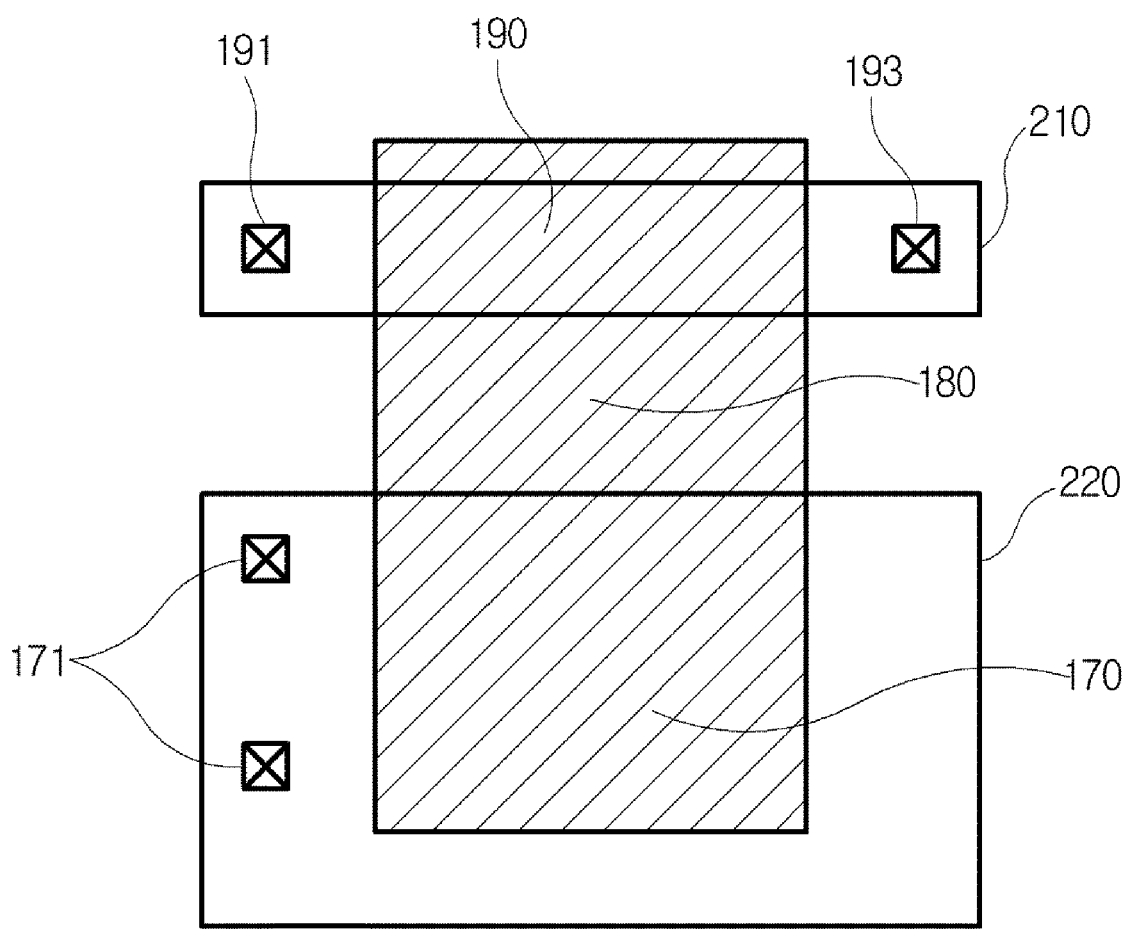
FIG. 5 is a plan view illustrating the single poly MTP cell in accordance with an example.

FIG. 5 is a plan view illustrating the single poly MTP cell in accordance with an example.

Referring to the example of FIG. 5, the single poly MTP cell 100 may include a first active region 210 and a second active region 220. The first active region 210 may sequentially place a source electrode 191, a sensing gate 190, and a drain electrode 193 to constitute the sensing transistor. Additionally, the second active region 220 may include the control gate 170 and the control gate electrode 171. In one example, the second active region 220 may receive the entire region of the control gate 170 and the control gate electrode 171, in order to enhance operational efficiency of the control gate 170. More specifically, the single poly MTP cell 100 may place the entire region of the control gate 170 within the second active region 220 in order to prevent the unnecessary voltage in the program operation or the erase operation from being delivered to the control gate 170.

Accordingly, the single poly MTP cell 100 may reduce the gate area outside of the second active region 220 of the control gate 170 and thereby enhance the program operation or erase operation efficiency of the data for the single poly MTP cell 100. Herein, it may be noted that the selection transistor does not exist in the single poly MTP cell 100. By adopting the Hot carrier injection and BTBT methods, as well as the method that repetitively applies a voltage with a short pulse to prevent the over-erase in advance, the selection transistor for preventing the over-erase phenomenon is not required. As a result, the area of the single poly MTP cell may be reduced.

In one example, the floating gate 180 may be formed over the first and second active regions 210, 220 in order to connect the sensing gate 190 and the control gate 170. That is, the floating gate 180 is formed to include the control gate 170 and the sensing gate 190 on the same plane. Electrons and/or holes may be injected into and/or emitted to the floating gate 180, depending upon the voltage applied to the control gate electrode 171, the source electrode 191, and the drain electrode 193.

Figure 6:
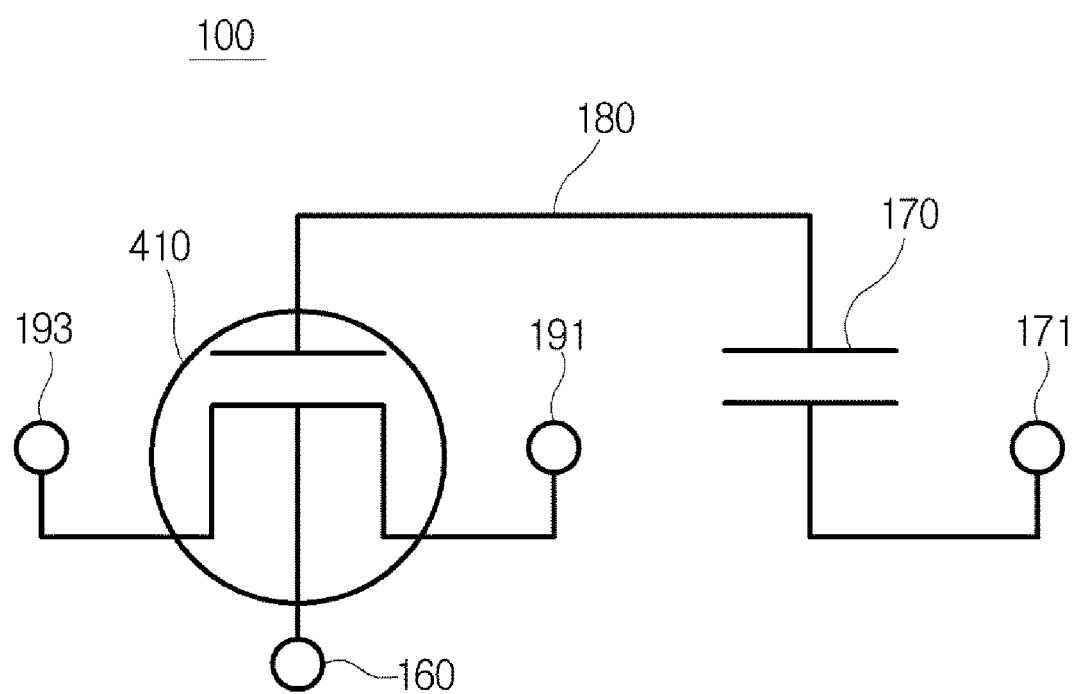
FIG. 6 is a circuit view illustrating the single poly MTP cell illustrated in the examples of FIGS. 1 to 4.

FIG. 6 is a circuit view illustrating the single poly MTP cell illustrated in the examples of FIGS. 1 to 4. Referring to the example of FIG. 6, the single poly MTP cell 100 proposed in the examples may be composed of the control gate 170 and a sensing transistor 410, and the selection transistor was removed and is not present. In the example of FIG. 6, the control gate 170 and the sensing gate 190 of the sensing transistor are connected by the floating gate 180. Thus, the program, erase, and read operations may be performed, depending upon the voltage applied to the control gate electrode 171, the source electrode 191, the drain electrode 193, and the body electrode 160.

In one example, the sensing transistor 410 may be implemented by using a tunneling region. That is, the sensing transistor may inject and/or emit electrons or holes in the program operation or erase operation of the data. The single poly MTP cell 100 may form the sensing transistor and the tunneling region in the same physical space to reduce the area of the single poly MTP cell 100.

Figure 7:
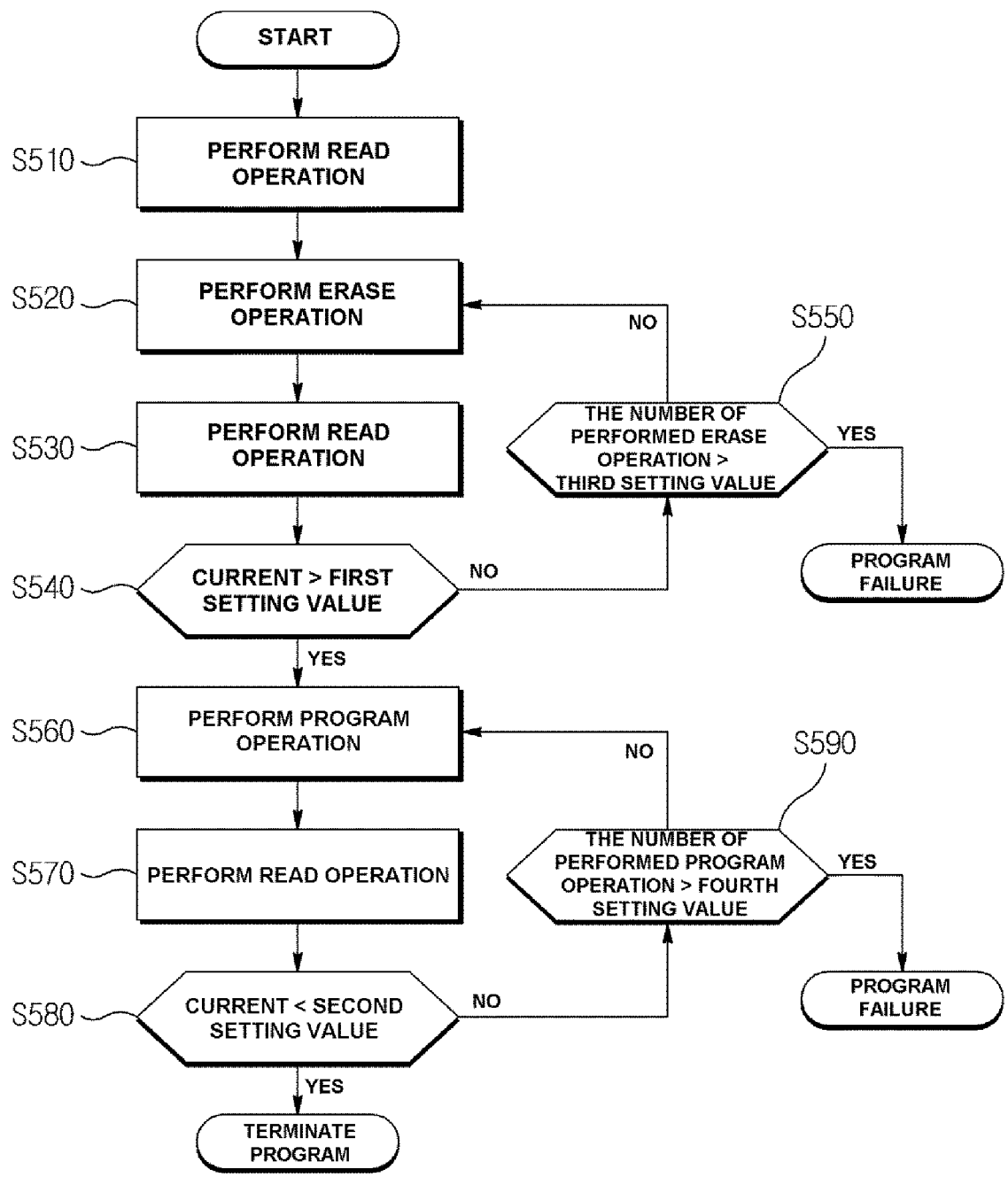
FIG. 7 is a flowchart illustrating the program operation and the erase operation of the single poly MTP cell proposed in the examples.

FIG. 7 is a flowchart illustrating the program and erase operations of the singe poly MTP cell proposed in the examples.

The general floating gate may indicate the value programmed, depending upon whether or not electrons are injected into the floating gate. That is, in the Single Level Cell, if electrons are injected into the floating gate, a logic '0' is denoted, and if electrons are not injected or holes are injected, a logic '1' is denoted instead.

For example, the erase operation is to be first performed for the program. Erasing first sets a baseline value. Generally, in order to integrate many cells, because the erase operation is simultaneously performed for a plurality of cells, the collective erase operation is performed for the plurality of cells instead of individual erase operations, and the program operation is performed separately for each cell, but erase and program operations are not limited to such an approach.

In one example corresponding to the example of FIG. 7, for the program operation, the erase operation is first performed and then the program operation is performed subsequently. That is, in order to program data in the single poly MTP cell, the read operation may be first performed at operation S510 to initialize the MTP cell. The read operation to act as an initialization operation is optional and is not required for the method.

After the read operation for initialization, the erase operation is performed at operation S520. For the performance of the erase operation, the source electrode 191 and the body electrode 160 are applied with a GND voltage, the drain electrode 193 is applied with a positive voltage (VPP), and the control gate electrode 171 is applied with the appropriate voltage that is slightly greater than or equal to the voltage applied to the source electrode 191 and the body electrode 160. As one example, the voltage value of VPP as about 9V may be applied thereto. Furthermore, as one example, the VPP may be a voltage in the range of 3V to 10V. In this case, the voltage applied to the control gate electrode 171 and the drain electrode 193 is maintained during a very short time period of 1~1000 μs. That is, the example adopts a method of repetitively applying a high voltage several times not during a lengthy time, but during a series of short times, in order to prevent the over-erase phenomenon.

After performing the erase operation that applies the voltage described above to the electrodes during a very short time period in operation S520, the read operation is performed in operation S530. For performing the read operation, the source electrode 191 and the body electrode 160 are applied with a GND voltage, and the control gate electrode 171 and the drain electrode 193 are applied with the voltage corresponding to a degree at which the holes injected into the floating gate 180 exit the floating gate 180 or a degree at which electrons or holes are not injected into the floating gate 180. That is, the drain electrode 193 may be applied with a first voltage for the sensing transistor to operate, and the control gate electrode 171 may be applied with a second voltage greater than the first voltage. In this example, the current flows between the drain and the source due to a potential difference applied between the drain electrode 193 and the source electrode 191. Therefore, it is possible to know whether or not the MTP cell has been programmed, based on the current amount flowing between the drain and the source when the read operation is performed. If there are many electrons emitted into the floating gate 180 or many holes injected into the floating gate 180, a much greater current value in the read operation is measured, and if there are many electrons injected into the floating gate 180, a much smaller current value is measured. Accordingly, if the measured current value of the MTP cell when the read operation is performed is greater than the first setting value, it is therefore determined that the MTP cell is successfully erased. If the current value of the MTP cell is smaller than the first setting value, it may be determined that electrons are not yet emitted sufficiently or too few holes are injected into the MTP cell, so it is therefore determined that the corresponding MTP cell has not been erased successfully.

If the current flowing into the MTP cell in the read operation performed after the erase operation is performed reaches the first setting value, it may be determined that the erase operation has been completed successfully, and if the current is smaller than or equal to the first setting value, it may be determined that the erase operation has not been completed successfully in operation S540.

If it is determined that the erase operation has not been completed successfully, the number of repetitions of the performed erase operation is compared with the third setting value in operation S550. As one example, the above-described erase operation may be performed several times or several tens of times in order to complete the erase operation successfully. Accordingly, if it is determined that the erase has not been completed successfully, even after the erase operation is performed a number of times equal to or greater than the third setting value, it may be determined that the erase operation has failed due to other problems. If the performed number of times for the erase operation is smaller than the third setting value, the erase operation is performed again by repeating the operations S520 to S550 until the erase operation is completed successfully.

If the erase operation has been completed successfully, the program operation may be performed at operation S560. For the program operation, the source electrode 191 and the body electrode 160 may each be applied with a signal GND, and the drain electrode 193 and the control gate electrode 171 may each be applied with a positive voltage (VPP), but operation S560 is not limited to this approach, and other similar approaches may be used in other examples. The source electrode 191 may be applied with a voltage lower than the voltage for the program, for example, the positive voltage (VPP). In another example, the drain electrode 193 may be applied with the voltage that is much smaller than the voltage (VPP) applied to the control gate electrode 171. Herein, as one example, the VPP may be a voltage in the range of 3V to 10V. In such an example, the voltage applied to the control gate electrode 171 and the drain electrode 193 is maintained during a very short time period of 1~1000 μs. That is, electrons are not injected into the floating gate 180 all at once, but only a small amount of such electrons may be injected.

After the program operation applying the above-described voltage to the electrodes during a very short time period is performed in operation S560, the read operation is performed in operation S570. As described above, if electrons are injected into the floating gate 180, the current value measured in the read operation is reduced. As one example, if the current value measured in the read operation is smaller than the second setting value, it may be determined that sufficient electrons are injected into the floating gate 180 to successfully complete the program operation S580. By contrast, if the measured current is greater than the second setting value, it is determined that sufficient electrons are not injected into the floating gate 180 and thus, it is determined that the program operation has not been completed successfully and the program operation may be performed again.

Before performing a new program operation, it is determined if the number of repetitions of the performed program operation is greater than the fourth setting value S590. If it is determined that the program operation has not been completed successfully, even after the program operation has been performed the number of times equal to or greater than the fourth setting value that is set, it may be determined that the program has failed due to other problems. If the performed number of times for the program operation is smaller than the fourth setting value, the program operation is again performed to repeat the operations S560 to S590 until the program operation is completed, successfully.

The examples as described above have the advantage that they may apply the voltage for the erase operation or the voltage for the program operation to the electrodes only during a short pulse time period, thus preventing the over-erase and the over-charge phenomena. As a result, the selection transistor for preventing the over-erase required in the conventional MTP cell may be omitted.

Figure 8:
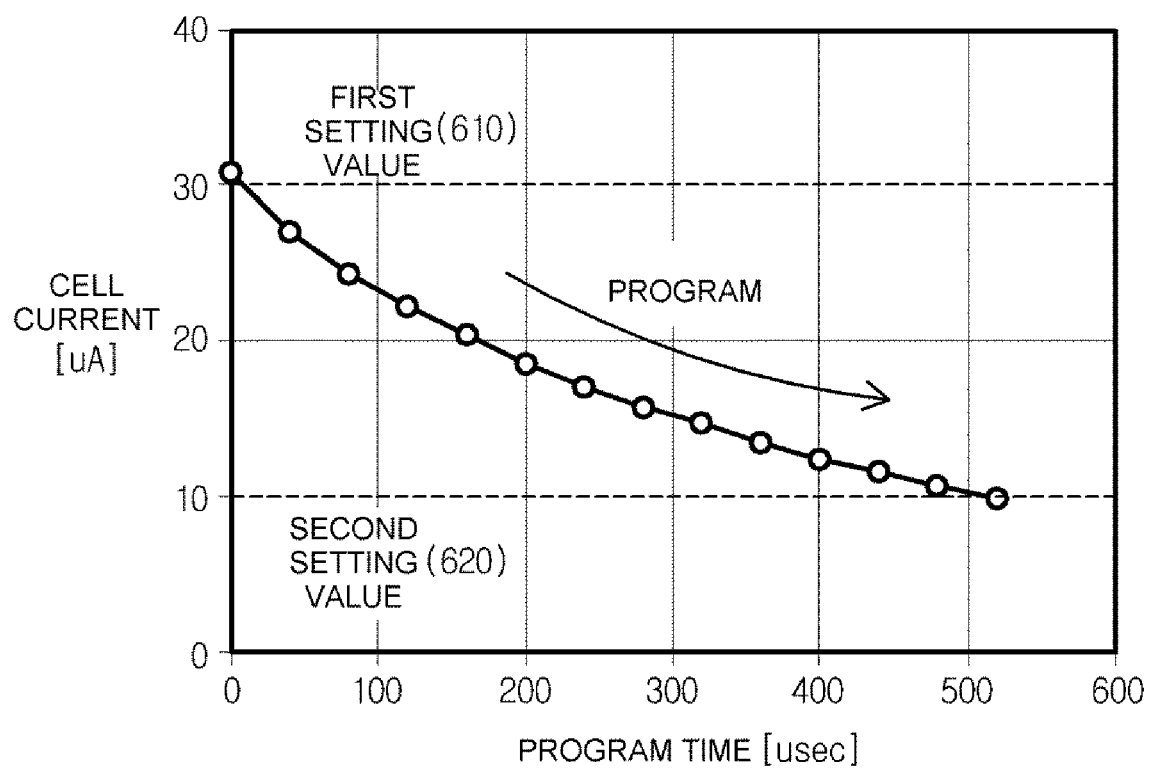
FIGS. 8 and 9 are views illustrating the cell current in accordance with the erase operation and the program operation illustrated in the example of FIG. 7.
Figure 9:
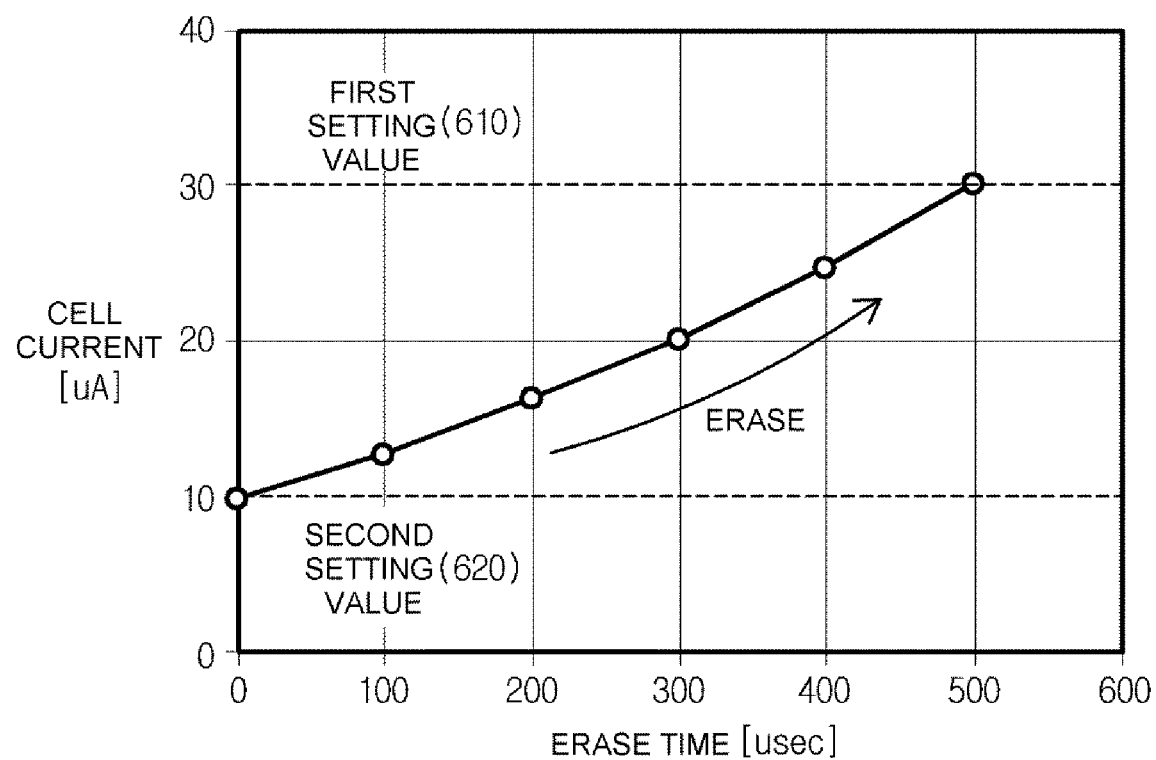

FIGS. 8 and 9 are views illustrating cell current in accordance with the erase operation and the program operation illustrated in the example of FIG. 7.

FIG. 8 is a view illustrating the change of the cell current in accordance with the program operation.

Referring to the example FIG. 8, the x axis represents the program time as a unit of μs (micro seconds), and the y axis represents the cell current as a unit of μA (micro Amperes).

Also, the portions of the graph of FIG. 8 denoted by 'o' may represent the times at which the read operation was performed. Thus, the program operation may be performed in the periods between these times at which the read operations were performed. Specifically, as in the example of FIG. 8, the program operation may be performed every 40 μs, but examples are not limited to this timing, and other time periods may be used between program operations. Also, the voltage for the above-described program operation may be applied to the electrodes for a short pulse time period of 5 to 200 μs every the program operation occurs. Thus, electrons are gradually injected into the floating gate 180 by applying a voltage for a short pulse time period. Thereby, the cell current may be reduced each time the program operation is performed. That is, in the example of FIG. 8, the MTP cell may measure the current that is greater than the first setting value 610, for example, 30 μA in the example of FIG. 8 in the read operation, to confirm that the value of the cell current gradually reduces in the read operation after each program operation occurs, and it may be determined that the cell current that is smaller than the second setting value 620, for example, 10 μA, in the example of FIG. 8 after 13 times of the program operation have been measured to complete the program operation successfully.

FIG. 9 is a view illustrating the change of the cell current in accordance with the erase operation.

Referring to the example of FIG. 9, the x axis represents the erase time as a unit of μs, and the y axis represents the cell current as a unit of μA, as discussed above with respect to FIG. 8. Furthermore, the portions denoted by 'o' in the example of FIG. 9 can represent the times at which the read operation was performed. Furthermore, the erase operation may be performed in the periods between the times at which the read operations were performed. Specifically, the erase operation in the example of FIG. 9 can be performed every 100 μs, but examples are not limited to this timing, and other time periods may be used between erase operations. Also, the voltage for the above-described erase operation may be applied to the electrodes for a short pulse time period of 5 to 500 μs every time the erase operation is performed. Thus, holes are injected into the floating gate 180 by applying a voltage for a short pulse time period or electrons are gradually emitted from the floating gate 180. As a result, the cell current may be increased each time the erase operation is performed. That is, in the example of FIG. 9, the MTP cell may measure the current that is smaller than the second setting value 620, for example, 10 μA, in the example of FIG. 9 to confirm that the value of the cell current is gradually increased in the read operation after each erase operation, and then it may be determined that the cell current that is greater than the first setting value 610, 30 μA, in the example of FIG. 9 after 5 times of the erase operation have been measured to complete the erase operation successfully.

Figure 10:
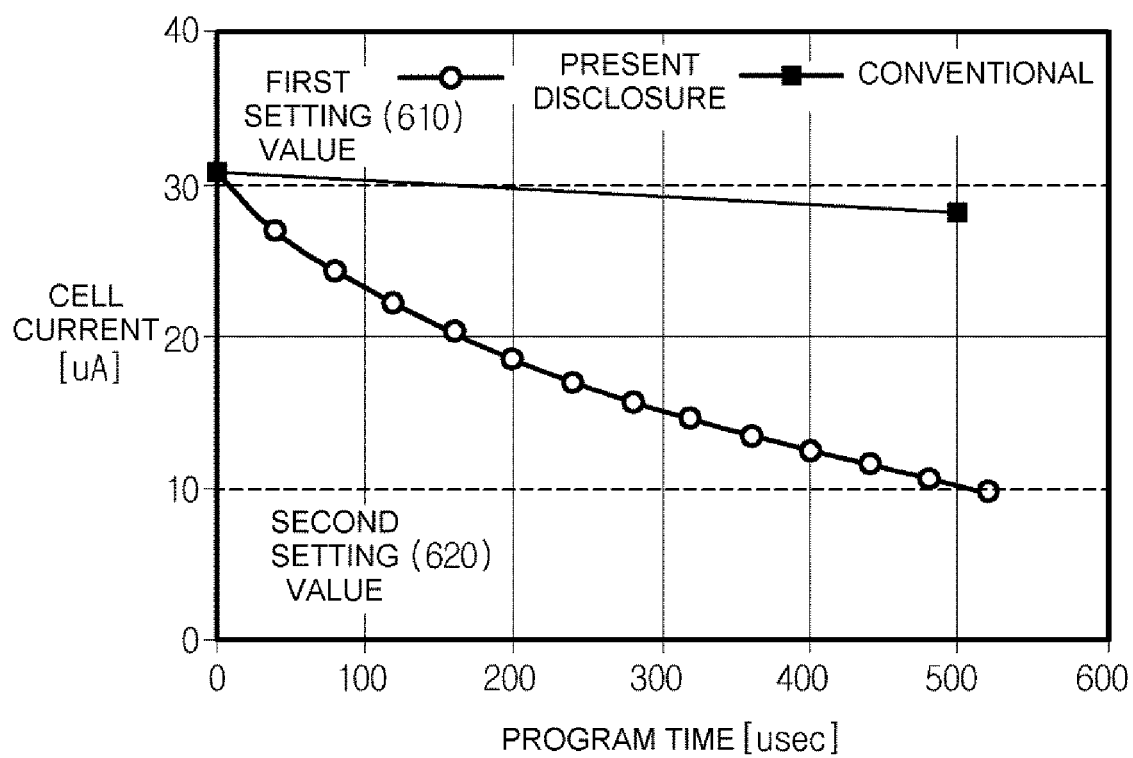
FIGS. 10 and 11 are views illustrating the changes of the cell currents in accordance with the program method and the erase method in accordance with an example of the present disclosure and an alternative program method and erase method.
Figure 11:
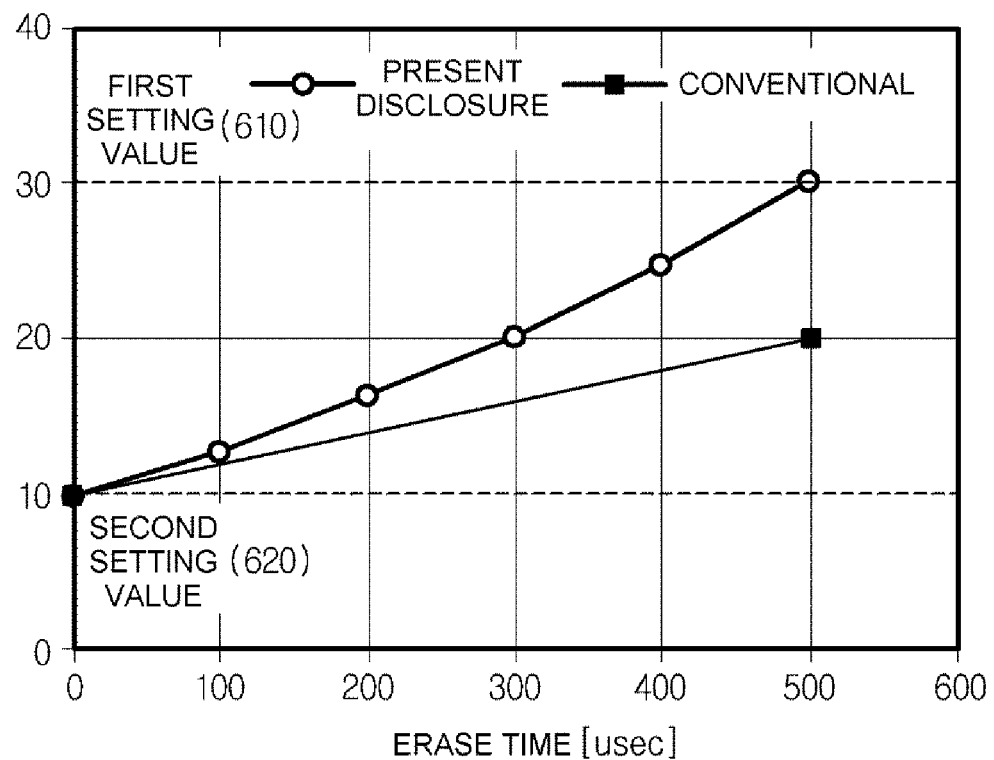

FIGS. 10 and 11 are views illustrating the changes of the cell currents in accordance with the program method and the erase method in accordance with the examples and the alternative program method and erase method.

Referring to the examples of FIGS. 10 and 11, the x axis represents the program or erase time as a unit of μs, and the y axis represents the cell current as a unit of μA. Here, the conventional program and erase methods refer to program and erase methods of an alternative technology, and the program and erase methods of the present disclosure refer to the program and erase methods provided in examples. The conventional program and erase methods apply a constant time to collectively perform the program operation or the erase operation. Specifically, the program operation and the erase operation are collectively performed during hundreds of μs to thousands of μs. On the other hand, the present disclosure applies the voltage for the program operation or the erase operation for a short pulse time period and repeat the operation measuring the cell current several times or dozens of times to perform the program operation or the erase operation. As illustrated in the examples of FIGS. 10 and 11, in case of applying a constant time to collectively perform the program operation or the erase operation as in the conventional method, it cannot be determined if the target cell current has been reached. Thus, it is necessary to apply a considerable, long time to be able to admit that the target cell current has been reached and thereby, more time is required than in the present disclosure to complete the program and erase operations. Accordingly, the method of programming or erasing by repeatedly applying the short time period of voltage proposed in the present disclosure has the advantage that the program operation or erase operation time period is faster than in the conventional method. Referring to the example of FIG. 10, it can be understood that the method in accordance with the present disclosure may successfully complete the program operation at about 520 μs, while the conventional method is almost in the initial stages of the program operation. Furthermore, referring to the example of FIG. 11, it may be understood that in accordance with the method of the present disclosure, the erase operation is completed at about 500 μs, while the conventional method at that point has only about 50% of the relevant data erased.

Thus, there is the advantage in the examples in that the reduction of the program operation and erase operation time periods may not only speed up the operation speed of the chip, but also reduce the testing time for a chip to save in the testing costs.

As described above, there are also advantages in that the single poly MTP cell proposed in the present disclosure may omit the selection transistor for preventing the over-erase used in the alternative structure, thus dramatically reducing the size of the MTP cell, and also the examples may propose the method of repeating the operation applying the voltage for a short pulse time several times or dozens of times to perform the program operation or the erase operation, thus not only performing the program and the erase within the time much faster than in the alternative method, but also preventing the over-erase and the over-charge phenomena.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A single poly multi time program (MTP) cell, comprising:

a second conductivity-type well;
a sensing transistor comprising a drain, a sensing gate, and a source;
a drain electrode connected to the drain;
a source electrode connected to the source;
a control gate connected to the sensing gate of the sensing transistor; and
a control gate electrode,
wherein the sensing transistor, the drain electrode, the source electrode, the control gate, and the control gate electrode are located on the second conductivity-type well.

2. The single poly MTP cell of claim 1, further comprising a first conductivity-type shallow well located on an upper portion of the second conductivity-type well and located on a lower portion of the control gate.

3. The single poly MTP cell of claim 2,
wherein the first conductivity-type shallow well is located directly adjacent to the second conductivity-type well.

4. The single poly MTP cell of claim 1,
wherein the sensing gate of the sensing transistor is implemented by a tunneling region providing a movement path of electrons or holes toward a lower end of the tunneling region.

5. The single poly MTP cell of claim 1,
wherein the cell forms a floating gate comprising the sensing gate and the control gate.

6. The single poly MTP cell of claim 1,
wherein the drain and the source of the sensing transistor are formed of a second doping layer and a third doping layer that are located on an upper portion of the second conductivity-type well on lower portions of the drain electrode and the source electrode, respectively.

7. The single poly MTP cell of claim 1, further comprising a fourth doping layer formed on a lower portion of the control gate electrode.

8. The single poly MTP cell of claim 7,
wherein the fourth doping layer directly contacts the first conductivity-type shallow well and has a same conductivity type as the first conductivity-type shallow well.

9. The single poly MTP cell of claim 1,
wherein high concentrations of cell Lightly Doped Drain (LDD) and/or Halo Implant areas are added in an entire region or some regions of the single poly MTP cell.

10. The single poly MTP cell of claim 1, further comprising a sensing transistor region in which the drain electrode, the sensing transistor, and the source electrode on the second conductivity-type well are located, and a control gate region in which the control gate and the control gate electrode on the second conductivity-type well or tea first conductivity-type well are located.

11. The single poly MTP cell of claim 1, further comprising an isolation film interposed between the sensing gate and the control gate.

12. The single poly MTP cell of claim 11,
wherein a first conductivity-type shallow well directly contacts the isolation film and has a depth shallower than a depth of the isolation film.

13. The single poly MTP cell of claim 1,
wherein a plurality of pulse voltages repeated during the erase time or the program time for the erase operation and the program operation are applied to the drain electrode, the source electrode, and the control gate electrode, and
wherein the current flowing into the single poly MTP cell between the plurality of repeated pulse voltages is measured to determine the completion of the erase operation or the program operation.

14. The single poly MTP cell of claim 1, further comprising:
a first doping layer formed in the second conductivity-type well; and
a body electrode formed on the first doping layer.

15. The single poly MTP cell of claim 1,
wherein the drain and the source directly contact the second conductivity-type well.

16. A single poly multi time program (MTP) cell, comprising:
a second conductivity-type well;
a first conductivity-type well located adjacent to the second conductivity-type well;
a sensing transistor comprising a drain, a sensing gate, and a source;
a drain electrode connected to the drain;
a source electrode connected to the source;
a control gate connected to the sensing gate; and
a control gate electrode,
wherein the sensing transistor, the drain electrode, and the source electrode are located on the second conductivity-type well, and
wherein the control gate and the control gate electrode are located on the first conductivity-type well.

17. The single poly MTP cell of claim 16,
wherein the sensing gate of the sensing transistor is implemented by a tunneling region providing the movement path of electrons or holes toward a lower end of the tunneling region.

18. The single poly MTP cell of claim 16,
wherein the cell forms a floating gate comprising the sensing gate and the control gate.

19. The single poly MTP cell of claim 16,
wherein the drain and the source of the sensing transistor are formed of a second doping layer and a third doping layer that are located on an upper portion of the second conductivity-type well on lower portions of the drain electrode and the source electrode, respectively.

20. The single poly MTP cell of claim 16, further comprising a fourth doping layer formed on a lower portion of the control gate electrode.

21. The single poly MTP cell of claim 16,
wherein high concentrations of cell Lightly Doped Drain (LDD) and/or Halo Implant areas are added in an entire region or some regions of the single poly MTP cell.

22. The single poly MTP cell of claim 16, further comprising a sensing transistor region in which the drain electrode, the sensing transistor, and the source electrode on the second conductivity-type well are placed, and a control gate region in which the control gate and the control gate electrode on the second conductivity-type well or the first conductivity-type well are located.

23. The single poly MTP cell of claim 16, further comprising an isolation film interposed between the sensing gate and the control gate.

24. The single poly MTP cell of claim 23,
wherein the first conductivity-type well directly contacts the second conductivity-type well under the isolation film.

25. The single poly MTP cell of claim 16,
wherein a plurality of pulse voltages repeated during the erase time or the program time for the erase operation and the program operation are applied to the drain electrode, the source electrode, and the control gate electrode, and wherein the current flowing into the single poly MTP cell between the plurality of repeated pulse voltages is measured to determine the completion of the erase operation or the program operation.

26. A single poly multi time program (MTP) cell, comprising:
- a first conductivity-type shallow well and a second conductivity-type well formed in a substrate;
- a sensing transistor comprising a drain, a sensing gate, and a source and being formed on the second conductivity-type well;
- a control gate connected to the sensing gate of the sensing transistor and being formed on the first conductivity-type shallow well; and
- an isolation film formed between the control gate and the sensing gate;
- wherein the first conductivity-type shallow well has a depth shallower than a depth of the second conductivity-type well.

27. The single poly MTP cell of claim 26, wherein the first conductivity-type shallow well directly contacts the isolation film and has a depth shallower than a depth of the isolation film.

28. The single poly MTP cell of claim 26, further comprising a control gate electrode formed adjacent to the control gate.

29. The single poly MTP cell of claim 26, further comprising a doping layer formed under the control gate electrode and having a same conductivity type as the first conductivity-type shallow well.

* * * * *